US006593247B1

(12) United States Patent
Huang et al.

(10) Patent No.: US 6,593,247 B1
(45) Date of Patent: Jul. 15, 2003

(54) METHOD OF DEPOSITING LOW K FILMS USING AN OXIDIZING PLASMA

(75) Inventors: Tzu-Fang Huang, San Jose, CA (US); Yung-Cheng Lu, Taipei (TW); Li-Qun Xia, San Jose, CA (US); Ellie Yieh, San Jose, CA (US); Wai-Fan Yau, Mountain View, CA (US); David W. Cheung, Foster City, CA (US); Ralf B. Willecke, Santa Clara, CA (US); Kuowei Liu, Campbell, CA (US); Ju-Hyung Lee, Campbell, CA (US); Farhad K. Moghadam, Saratoga, CA (US); Yeming Jim Ma, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/553,461

(22) Filed: Apr. 19, 2000

Related U.S. Application Data

(63) Continuation-in-part of application No. 09/247,381, filed on Feb. 10, 1999, and a continuation-in-part of application No. 09/185,555, filed on Nov. 4, 1998, and a continuation-in-part of application No. 09/162,915, filed on Sep. 29, 1998, and a continuation-in-part of application No. 09/114,682, filed on Jul. 13, 1998, now Pat. No. 6,072,227, and a continuation-in-part of application No. 09/021,788, filed on Feb. 11, 1998, now Pat. No. 6,054,379.

(51) Int. Cl.[7] ............................................. H01L 21/31

(52) U.S. Cl. ....................... 438/758; 438/759; 438/760; 438/623; 438/638; 257/642

(58) Field of Search ................................. 438/758, 759, 438/760, 623, 638, 789, 780; 257/642, 635

(56) References Cited

U.S. PATENT DOCUMENTS 4,168,330 A    9/1979   Kaganowicz ................ 427/39

(List continued on next page.)

FOREIGN PATENT DOCUMENTS

DE    19654737    7/1997    ........... H01L/21/31

(List continued on next page.)

OTHER PUBLICATIONS

"Low Dielectric Constant Carbon Containing SiO2 Films Deposited by PECVD Technique Using a Novel CVD Precursor" Feb. 10–11, 1997 DUMIC Conference, 1997 ISMIC—222D/97/0019, pp. 19–25.

(List continued on next page.)

*Primary Examiner*—John F. Niebling
*Assistant Examiner*—Olivia T Luk
(74) *Attorney, Agent, or Firm*—Moser, Patterson & Sheridan

(57) ABSTRACT

A silicon oxide layer is produced by plasma enhanced oxidation of an organosilicon compound to deposit films having a carbon content of at least 1% by atomic weight. Films having low moisture content and resistance to cracking are deposited by introducing oxygen into the processing chamber at a flow rate of less than or equal to the flow rate of the organosilicon compounds, and generating a plasma at a power density ranging between 0.9 W/cm$^2$ and about 3.2 W/cm$^2$. An optional carrier gas may be introduced to facilitate the deposition process at a flow rate less than or equal to the flow rate of the organosilicon compounds. The organosilicon compound preferably has 2 or 3 carbon atoms bonded to each silicon atom, such as trimethylsilane, $(CH_3)_3SiH$. An oxygen rich surface may be formed adjacent the silicon oxide layer by temporarily increasing oxidation of the organosilicon compound.

63 Claims, 3 Drawing Sheets

U.S. PATENT DOCUMENTS

| | | | |
|---|---|---|---|
| 4,557,946 A | 12/1985 | Sacher et al. | 427/41 |
| 4,789,648 A | 12/1988 | Chow et al. | 437/225 |
| 4,798,629 A | 1/1989 | Wood et al. | 106/287.16 |
| 4,812,325 A | 3/1989 | Ishihara et al. | 427/69 |
| 4,824,690 A | 4/1989 | Heinecke et al. | 427/38 |
| 4,828,880 A | 5/1989 | Jenkins et al. | 427/167 |
| 4,845,054 A | 7/1989 | Mitchener | 437/238 |
| 4,894,352 A | 1/1990 | Lane et al. | 437/238 |
| 4,900,591 A | 2/1990 | Bennett et al. | 427/255 |
| 4,973,511 A | 11/1990 | Farmer et al. | 428/216 |
| 4,981,724 A | 1/1991 | Hochberg et al. | 427/255.3 |
| 5,028,566 A | 7/1991 | Lagendijk | 437/238 |
| 5,040,046 A | 8/1991 | Chhabra et al. | 357/54 |
| 5,093,153 A | 3/1992 | Brochot et al. | 427/41 |
| 5,120,680 A | 6/1992 | Foo et al. | 437/238 |
| 5,124,014 A | 6/1992 | Foo et al. | 204/192.32 |
| 5,204,141 A | 4/1993 | Roberts et al. | 427/255.3 |
| 5,224,441 A | 7/1993 | Felts et al. | 118/718 |
| 5,246,887 A | 9/1993 | Yu | 437/238 |
| 5,250,473 A | 10/1993 | Smits | 437/238 |
| 5,279,867 A | 1/1994 | Friedt et al. | 427/583 |
| 5,290,736 A | 3/1994 | Sato et al. | 437/238 |
| 5,298,587 A | 3/1994 | Hu et al. | 528/10 |
| 5,314,724 A | 5/1994 | Tsukune et al. | 427/489 |
| 5,352,493 A | 10/1994 | Dorfman et al. | 427/530 |
| 5,360,646 A | 11/1994 | Morita | 427/574 |
| 5,362,526 A | 11/1994 | Wang et al. | 427/573 |
| 5,364,666 A | 11/1994 | Williams et al. | 427/579 |
| 5,465,680 A | 11/1995 | Loboda | 117/84 |
| 5,466,431 A | 11/1995 | Dorfman et al. | 423/446 |
| 5,468,520 A | 11/1995 | Williams et al. | 427/560 |
| 5,492,736 A | 2/1996 | Laxman et al. | 427/579 |
| 5,494,712 A | 2/1996 | Hu et al. | 427/489 |
| 5,508,368 A | 4/1996 | Knapp et al. | 427/534 |
| 5,554,570 A | 9/1996 | Maeda et al. | 437/235 |
| 5,559,367 A | 9/1996 | Cohen et al. | 257/77 |
| 5,563,105 A | 10/1996 | Dobuzinsky et al. | 437/240 |
| 5,578,523 A | 11/1996 | Fiordalice et al. | 437/190 |
| 5,593,741 A | 1/1997 | Ikeda | 427/579 |
| 5,598,027 A | 1/1997 | Matsuura | 257/635 |
| 5,599,740 A | 2/1997 | Jang et al. | 437/190 |
| 5,616,369 A | 4/1997 | Williams et al. | 427/536 |
| 5,618,619 A | 4/1997 | Petrmichl et al. | 428/334 |
| 5,637,351 A | 6/1997 | O'Neal et al. | 427/255.3 |
| 5,638,251 A | 6/1997 | Goel et al. | 361/313 |
| 5,679,413 A | 10/1997 | Petrmichl et al. | 427/534 |
| 5,683,940 A | 11/1997 | Yahiro | 437/195 |
| 5,693,563 A | 12/1997 | Teong | 437/190 |
| 5,700,720 A | 12/1997 | Hashimoto | 437/195 |
| 5,703,404 A | 12/1997 | Matsuura | 257/758 |
| 5,739,579 A | 4/1998 | Chiang et al. | 257/635 |
| 5,753,564 A | 5/1998 | Fukada | 437/238 |
| 5,789,319 A | 8/1998 | Havemann et al. | 438/668 |
| 5,800,877 A | 9/1998 | Maeda et al. | 427/535 |
| 5,807,785 A | 9/1998 | Ravi | 438/624 |
| 5,821,168 A | 10/1998 | Jain | 438/692 |
| 5,834,162 A | 11/1998 | Malba | 430/317 |
| 5,858,880 A | 1/1999 | Dobson et al. | 438/758 |
| 5,874,367 A | 2/1999 | Dobson | 438/787 |
| 5,888,593 A | 3/1999 | Petrmichl et al. | 427/563 |
| 5,891,799 A | 4/1999 | Tsui | 438/624 |
| 5,989,998 A | 11/1999 | Sugahara et al. | 438/623 |
| 6,037,274 A | 3/2000 | Kudo et al. | 438/778 |
| 6,051,321 A | 4/2000 | Lee et al. | 428/447 |
| 6,054,206 A | 4/2000 | Moountsier | 428/312.8 |
| 6,054,379 A * | 4/2000 | Yau et al. | 438/623 |
| 6,068,884 A | 5/2000 | Rose et al. | 427/255.6 |
| 6,072,227 A * | 6/2000 | Yau et al. | 257/642 |
| 6,080,526 A | 6/2000 | Yang et al. | 430/296 |
| 6,124,641 A | 9/2000 | Matsuura | 257/759 |
| 6,140,226 A | 10/2000 | Grill et al. | 438/637 |
| 6,147,009 A | 11/2000 | Grill et al. | 438/780 |
| 6,159,871 A | 12/2000 | Loboda et al. | 438/786 |
| 6,176,198 B1 | 1/2001 | Kao et al. | 118/723 |
| 6,238,751 B1 | 5/2001 | Mountsier | 427/574 |
| 6,245,690 B1 | 6/2001 | Yau et al. | 438/780 |
| 6,258,735 B1 | 7/2001 | Xia et al. | 438/788 |
| 6,287,990 B1 | 9/2001 | Cheung et al. | 438/780 |
| 6,303,523 B2 | 10/2001 | Cheung et al. | 438/780 |
| 6,312,793 B1 | 11/2001 | Grill et al. | 428/312.6 |
| 6,316,063 B1 | 11/2001 | Andideh et al. | 427/577 |
| 6,340,435 B1 | 1/2002 | Bjorkman et al. | 216/72 |
| 6,340,628 B1 | 1/2002 | Van Cleemput et al. | 438/586 |
| 6,348,421 B1 | 2/2002 | Shu et al. | 438/788 |
| 6,348,725 B2 * | 2/2002 | Cheung et al. | 257/642 |
| 6,368,924 B1 | 4/2002 | Mancini et al. | 438/286 |
| 6,383,955 B1 | 5/2002 | Matsuki et al. | 438/790 |
| 6,410,462 B1 | 6/2002 | Yang et al. | 438/788 |
| 6,410,463 B1 | 6/2002 | Matsuki | 438/790 |
| 6,413,583 B1 | 7/2002 | Moghadam et al. | 427/249.15 |
| 6,432,846 B1 | 8/2002 | Matsuki | 438/790 |
| 6,437,443 B1 | 8/2002 | Grill et al. | 257/758 |
| 6,441,491 B1 | 8/2002 | Grill et al. | 257/759 |
| 6,448,176 B1 | 9/2002 | Grill et al. | 438/637 |
| 6,448,186 B1 | 9/2002 | Olson et al. | 438/758 |
| 6,479,110 B2 | 11/2002 | Grill et al. | 427/577 |
| 6,479,408 B2 | 11/2002 | Shioya et al. | 438/789 |
| 6,479,409 B2 | 11/2002 | Shioya et al. | 438/790 |
| 2001/0004479 A1 | 6/2001 | Cheung et al. | 427/553 |
| 2001/0005546 A1 | 6/2001 | Cheung et al. | 428/210 |
| 2001/0021590 A1 | 9/2001 | Matsuki | 438/780 |
| 2001/0031563 A1 | 10/2001 | Shioya et al. | 438/790 |
| 2001/0051445 A1 | 12/2001 | Shioya et al. | 438/778 |
| 2001/0055672 A1 | 12/2001 | Todd | 428/212 |
| 2002/0068458 A1 | 6/2002 | Chiang et al. | 438/694 |
| 2002/0098714 A1 | 7/2002 | Grill et al. | 438/778 |

FOREIGN PATENT DOCUMENTS

| | | | |
|---|---|---|---|
| DE | 198 04 375 A1 | 2/1998 | H01L/21/312 |
| DE | 199 04 311 A1 | 8/1999 | C23C/16/44 |
| EP | 0469926 A1 | 2/1992 | C08J/7/06 |
| EP | 0519079 A1 | 12/1992 | H01L/21/312 |
| EP | 0522799 A2 | 1/1993 | H01L/21/90 |
| EP | 0711817 A2 | 5/1996 | C09D/183/04 |
| EP | 0721019 A2 | 7/1996 | C23C/16/40 |
| EP | 0721019 A3 | 7/1996 | H01L/21/316 |
| EP | 0743675 A1 | 11/1996 | H01L/21/312 |
| EP | 0771 886 A1 | 5/1997 | C23C/16/36 |
| EP | 0774533 A1 | 5/1997 | C23C/16/40 |
| EP | 0 840 365 | 5/1998 | H01L/21/311 |
| EP | 0 849 789 | 6/1998 | H01L/21/768 |
| EP | 0885983 A1 | 12/1998 | C23C/16/30 |
| EP | 0926 715 A2 | 6/1999 | H01L/21/3105 |
| EP | 0926 724 A2 | 6/1999 | H01L/21/76 |
| EP | 0935 283 A2 | 8/1999 | H01L/21/312 |
| EP | 1 037 275 A1 | 9/2000 | H01L/21/768 |
| EP | 1 123 991 A2 | 8/2001 | C23C/16/40 |
| GB | 2316 535 A | 2/1998 | H01L/21/31 |
| JP | SHO59(1984)-98726 | 6/1984 | B01J/12/00 |
| JP | 60-111480 | 6/1985 | H01L/33/00 |
| JP | 01050429 | 2/1989 | H01L/21/318 |
| JP | 05267480 | 10/1993 | H01L/21/90 |
| JP | 6-163521 | 6/1994 | H01L/21/314 |
| JP | 6-168937 | 6/1994 | H01L/21/316 |
| JP | 8-222559 | 8/1996 | H01L/21/316 |
| JP | 8-236518 | 9/1996 | H01L/21/316 |
| JP | 8-288286 | 11/1996 | H01L/21/316 |
| JP | 9-8031 | 1/1997 | H01L/21/316 |
| JP | 9-64029 | 3/1997 | H01L/21/316 |
| JP | 9-237785 | 9/1997 | H01L/21/316 |
| JP | 9-251997 | 9/1997 | H01L/21/316 |

| | | | |
|---|---|---|---|
| JP | Hei 9(1997)-237785 | 9/1997 | ......... H01L/21/316 |
| JP | 9-260369 | 10/1997 | ......... H01L/21/316 |
| JP | 10-242143 | 9/1998 | ......... H01L/21/316 |
| JP | 11-25193 | 9/1999 | ....... H01L/21/3065 |
| WO | WO 92/12535 | 7/1992 | ......... H01L/21/312 |
| WO | WO 94/01885 | 1/1994 | ......... H01L/21/316 |
| WO | WO 98-08249 | 2/1998 | ......... H01L/21/312 |
| WO | WO 98/59089 | 12/1998 | ........... C23C/16/30 |
| WO | WO 99/38202 | 7/1999 | ......... H01L/21/312 |
| WO | WO 99/41423 | 9/1999 | |
| WO | WO 99/55526 | 11/1999 | ............. B32B/9/04 |
| WO | WO 00/01012 | 1/2000 | ........... H01L/23/48 |
| WO | WO 01/01472 A1 | 1/2001 | ......... H01L/21/312 |
| WO | WO 02/43119 A2 | 5/2002 | |

OTHER PUBLICATIONS

"Reactivity of Alkylsilanes and Alkylcarbosilanes in Atomic Hydrogen–Induced Chemical Vapor Deposition" by A.M. Wrobel, et al. Polish Academy of Sciences, Centre of Molecular and Macromolecular Studies, 90–363 Lodz, Poland, pp. 1060–1065.

"Diamondlike Carbon Materials as Low–k Dielectrics" by A. Grill, et al. 1997 Materials Research Society, pp. 417–423.

"Dielectric Material Integration for Microelectronics" by W. D. Brown from Dielectric Science and Technology and Electronics Divisions Proceedings vol. 98–3, 8 pages.

"A Comparative Study of Sub–Micro Gap Filling and Planarization Techniques" by A. Hass Bar–Ilan, et al. Tower Semiconductor Ltd. Israel, SPIE vol. 2636, pp. 277–288.

"Characterization of High Density Plasma Chemical Vapor Deposited a–Carbon and a–Fluorinated Carbon Films for Ultra Low Dielectric Application" by Stuardo Robles, et al. Feb. 10–11, 1997 DUMIC Conference 1997 ISMIC—222D/97/0026, pp. 26–33.

"Environmental, Safety, and Health Issues in IC ProductionJ" by Rafael Reif, et al. Materials Research Society Symposium Proceedings vol. 447 Dec. 4–5, 1996, Boston, Mass. 6 pages.

"Deposition of Low–k Dielectric Films Using Trimethylsilane" by M.J. Lodoa, et al. Electrochemical Society Proceedings vol. 98–6, pp. 145–152.

"Silicon Nitride and Silicon Dioxide Thin Insulating Films" by M. Jamal Deen, et al. Dielectric Science and Technology and Electronics Divisions Proceedings vol. 97–10, pp. 443–453.

"Low Dielectric Constant Oxide Films Deposited Using CVD Techniques" by S. McClatchie Feb. 16–17, 1998 DUMIC Conference 1998 IMIC—333D/98/0311 pp. 311–318.

"Plasma Polymerization of Trimethylsilane in Cascade Arc Discharge" by Y.S. Lin, et al. Department of Chemical Engineering, and Center for Surface Science and Plasma Technology, University of Missouri–Columbia, Received Jan. 15, 1997; accepted 4 Feb. 1997, pp. 1653–1665.

European Patent Search Report Dated Oct. 26, 2000.

"Correlations Between Wetting and Structure in Methylsiloxane Layers on Oxides Formed by Chemical Vapor Surface Modification", Hiroaki Tada, Koichiro Nakamura, and Hirotsugu Nagayama, The Journal of Physical Chemistry, vol. 98, No. 47 (Nov. 24, 1994).

"Novel Low K Dielectrics Based on Diamondlike Carbon Materials", A. Grill, C. Jahnes, J. Electrochemical Soc., vol. 145, No. 5 (May, 1998).

European Search Report from EP 00 11 2300, Dated Aug. 24, 2001.

Laura Peters, "Pursuing the Perfect Low–K Dielectric," Semiconductor International, Sep. 1998.

Bin Zhao and Maureen Brongo, "Integration of Low Dielectric Constant Materials in Advanced Aluminum and Copper Interconnects," Mat. Res. Soc. Symp. Proc, vol. 564, Materials Research Society, 1999, pp. 485–497.

"Low Dielectric Constant Insulator Formed by Downstream Plasma CVD at Room Temperature Using TMS/O2", A. Nara and H.Itoh, Japanese Journal of Applied Physics, vol. 36. No. 3B (Mar. 1997).

"Low Dielectric Constant Films Prepared by Plasma–Enhanced Chemical Vapor Deposition From Tetramethylsilane" A. Grill and V. Patel, Journal of Applied Physics, vol. 85. No. 6 (Mar. 1999).

Luther et al., "Planar Copper–Polyimide Back End Of The Line Interconnections For ULSI Devices", Jun. 8–9 1993, VMIC Conference, 1993 ISMIC–102/93/0015, pp. 15–21.

C. Rau et al, "Mechanisms Of Plasma Polymerization Of Various Silico–Organic Monomers", Thin Solid Films, pp. 28–37, 249 (1994).

S. Sahli et al., "Properties Of Plasma–Polysiloxane Deposited By PECVD", Materials Chemistry and Physics, pp. 106–109, 33 (1993).

"Low Dielectric Constant Filowfill Technology For IMD Applicatins" S. McClatchie, et al., DUMIC Conference 1997 ISMIC–222D/97/0034 (Feb. 10–11, 1997).

D.S. Kim et al., "Deposition Of Thermally Stable, Low Dielectric Constant Fluorocarbon/SiO2 Composite Thin Film", American Institute Of Physics, Appl. Phys. Lett., vol. 69, No. 18, Oct. 28, 1996, pp. 2776–2778.

V. Hazari et al., Characterization Of Alternative Chemistries For Depositing PECVD Silicon Dioxide Films, DUMIC Conference,—333D/98/0319, pp. 319–326, Feb. 1998.

R. McCabe et al., "Large Area Diamond–Like Carbon Coatings By Ion Implantation", Surface Engineering vol. III: Process Technology and Surface Analysis, pp. 163–172, 1995.

pg,12

P. Favia, "Plasma Deposition Of Thin Films From a Fluorine—Containing Cyclosiloxane", Journal Of Polymer Science: Part A: Polymer Chemistry, 1992, 10 pp.

M. R. Wertheimer et al., "Advances In Basic And Applied Aspects Of Microwave Plasma Polymerization", Thin Solid Films, 115 (1984) pp. 109–124.

J.A. Theil et al., "Carbon Content Of Silicon Oxide Films Deposited By Room Temperature Plasma Enhanced Chemical Vapor Deposition Of Hexamethyldisloxane And Oxygen", Journal of Vacuum Science Technology, A 12(4), Jul./Aug. 1994, pp. 1365–1370.

N. Inagaki et al., "Plasma Polymerization Of Organosilicon Compounds", Journal of Applied Polymer Science, vol. 30, pp. 3385–3395.

Y Segui et al., "In Situ Electrical Property Measurements Of Metal (Plasma Polysiloxane)/Metal Structures", Thin Solid Films, 155 (1987) pp. 175–185, Electronics and Optics.

Y. Segui et al., "Gas Discharge In Hexamethyldisiloxane", Journal of Applied Polymer Science, vol. 20 pp. 1611–1618 (1976).

N. Inagaki et al., "Preparation Of Siloxane–Like Films By Glow Discharge Polymerization", Journal of Applied Polymer Science, vol. 29, pp. 3593–3605 (1984).

V.S. Nguyen et al., "Plasma Organosilicon Polymers", J. Electrochem. Soc. Solid–State Science and Technology, vol. 132, No. 8, pp. 1925–1932, Aug. 1985.

K. J. Taylor et al., "Parylene Copolymers", Spring MRS, Symposium N, pp. 1–9, 1997.

"Advanced $SiO_2$ Planarization Using Silane and $H_2O_2$", Dobson, C.D., Kiermasz, A., Beekmanm K., Wilby, R.J., Dec. 1994, pp. 85–88.

"Applied Surface Science", Feldman, L.C., van der Weg, W.F., vol. 43 (1989), pp. 301–303.

"Vacuum, Surfaces, and Films" from Journal of Vacuum Science & Technology A, vol. 13, No. 2, Mar./Apr. 1995, pp. 475–480.

"Novel Self–Planarizing CVD Oxide for Interlayer Dielectric Applications", Matsuura, M., Hayashide, Y., Kotani, H., Nishimura, T., Iuchi, H., Dobson, C.D., Kiermasz, A., Beekmann, K. and Wilby, R., 1994, pp. 5.7.1–5.7.4.

"Silicon dioxide chemical vapor deposition using silane and hydrogen peroxide", Gaillard, F., Brault, P. and Brouquet, P., J. Vac. Sci. Technol. B 14(4), Jul./Aug. 1996, pp. 2767–2769.

* cited by examiner

METHOD OF DEPOSITING LOW K FILMS USING AN OXIDIZING PLASMA

RELATED APPLICATIONS

This application is a continuation-in-part of U.S. patent application Ser. No. 09/021,788 [AMAT/2592], now U.S. Pat. No. 6,054,379 which was filed on Feb. 11, 1998 a continuation-in-part of U.S. patent application Ser. No. 09/114,682 [AMAT/2592.02], now U.S. Pat. No. 6,072,227 which was filed on Jul. 13, 1998, a continuation-in-part of U.S. patent application Ser. No. 09/162,915 [AMAT/3032], which was filed on Sep. 29, 1998; and a continuation-in-part of co-pending U.S. patent application Ser. No. 09/185,555 [AMAT/3032.P1], which was filed on Nov. 4, 1998, and a continuation-in-part of co-pending U.S. patent application Ser. No. 09/247,381 [AMAT/3032.P2], filed on Feb. 10, 1999. Each of the related applications is incorporated by reference herein.

BACKGROUND OF THE DISCLOSURE

1. Field of the Invention

The present invention relates to the fabrication of integrated circuits. More particularly, the invention relates to a process for depositing dielectric layers on a substrate.

2. Background of the Invention

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

In order to further reduce the size of devices on integrated circuits, it has become necessary to use conductive materials having low resistivity and insulators having low k (dielectric constant<4.0) to reduce the capacitive coupling between adjacent metal lines. Liner/barrier layers have been used between the conductive materials and the insulators to prevent diffusion of byproducts such as moisture onto the conductive material. For example, moisture that can be generated during formation of a low k insulator readily diffuses to the surface of the conductive metal and increases the resistivity of the conductive metal surface. A barrier/liner layer formed from conventional silicon oxide or silicon nitride materials can block the diffusion of the byproducts. However, the barrier/liner layers typically have dielectric constants that are significantly greater than 4.0, and the high dielectric constants result in a combined insulator that does not significantly reduce the dielectric constant.

The deposition of silicon oxide films that contain carbon and have low dielectric constants is described in World Patent Publication No. WO 99/41423, which published on Aug. 19, 1999, and is incorporated by reference herein. Films having dielectric constants of about 3.0 or less are deposited from organosilicon compounds at conditions sufficient to deposit silicon oxide films that contain from 1% to 50% carbon by atomic weight carbon-containing films. Curing of the films to remove moisture improves the barrier properties of the films. The retention of carbon in the films contributes to the low dielectric constants. Carbon is more readily retained in the films at deposition conditions that do not fully remove moisture from the films, thus, favoring deposition and then curing of the film. However, films that retain substantial moisture may shrink and crack during curing which detracts from the smoothness of the film or subsequent layers. Process conditions that avoid shrinkage of the films are desired.

SUMMARY OF THE INVENTION

The present invention provides a method for depositing a silicon oxide layer having low moisture content and a low dielectric constant. The silicon oxide layer is produced by plasma enhanced oxidation of an organosilicon compound to deposit films having a carbon content of at least 1% by atomic weight. Preferably, during the deposition process, oxygen is introduced into the processing chamber at a flow rate of less than or equal to the flow rate of the organosilicon compounds, and the plasma is generated at a power density ranging between 0.9 W/cm$^2$ and about 3.2 W/cm$^2$. An optional carrier gas may be introduced to facilitate the deposition process at a flow rate less than or equal to the flow rate of the organosilicon compounds. The organosilicon compound preferably has 2 or 3 carbon atoms bonded to each silicon atom, such as trimethylsilane, $(CH_3)_3SiH$. An oxygen rich surface may be formed adjacent the silicon oxide layer by temporarily increasing oxidation of the organosilicon compound.

Another aspect of the invention provides for controlling process conditions to deposit a silicon oxide layer having an atomic ratio of carbon to silicon (C:Si) of greater than or equal to about 1:9. Preferably the atomic ratio of carbon to silicon (C:Si) is less than about 1:1. The silicon oxide layer is produced by plasma enhanced oxidation of an organosilicon compound, preferably in the presence of an oxidizing gas and an inert carrier gas.

The silicon oxide layers can replace conventional or low k silicon oxide layers such as in intermetal dielectric layers, as dielectric layers in a damascene process, or as adhesion layers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
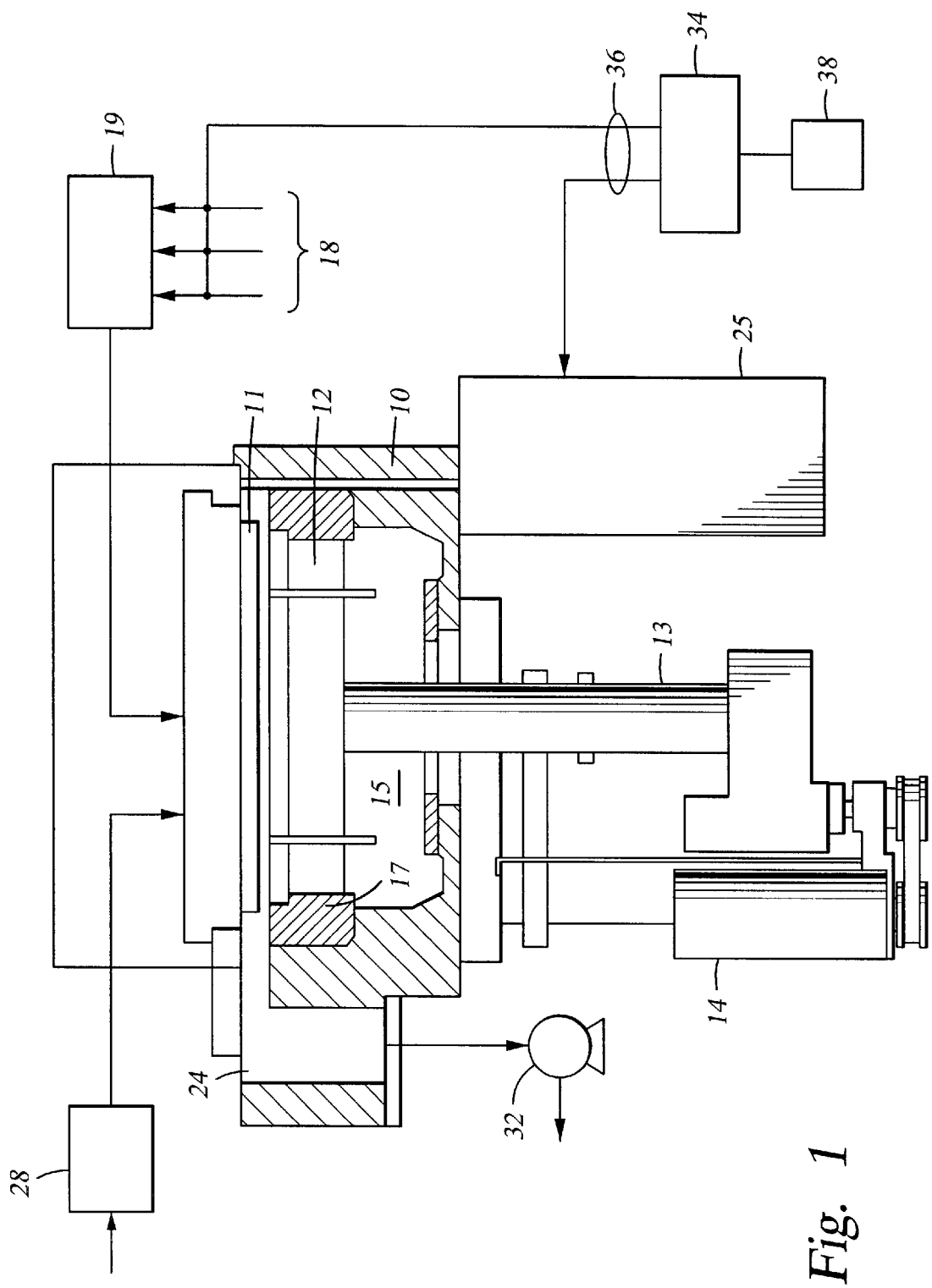
FIG. 1 is a cross-sectional diagram of an exemplary CVD plasma reactor configured for use according to the present invention.

For a further understanding of the present invention, reference should be made to the ensuing detailed description.

DETAILED DESCRIPTION OF THE PREFERRED EMBODIMENT

The present invention is described by reference to a method and apparatus for depositing a silicon oxide layer having a low dielectric constant and low moisture content. The low moisture content reduces or eliminates curing of the film and enhances surface smoothness, good hydrophobic properties, a high cracking threshold, and good barrier properties. The silicon oxide layer is produced by oxidizing an organosilicon compound which can be used as a dielectric layer, a lining layer adjacent other dielectric materials, an etch stop layer adjacent other dielectric materials, or as an adhesion layer between different materials. The oxidized organosilicon material is deposited by plasma assisted oxidation of the organosilicon compounds using a power density ranging between about 0.03 W/cm$^2$ and about 3.2 W/cm$^2$, which is a RF power level of between about 10 W and about 1000 W for a 200 mm substrate. The silicon oxide layer can be deposited continuously or with interruptions, such as changing chambers or providing cooling time, to improve porosity. The RF power is preferably provided at a high frequency such as between 13 MHz and 14 MHz. The RF power is preferably provided continuously or in short duration cycles wherein the power is on at the stated levels for cycles less than about 200 Hz and the on cycles total between about 10% and about 30% of the total duty cycle.

The silicon oxide layer contains carbon which contributes to low dielectric constants and barrier properties. The remaining carbon content of the deposited film is between about 1% and about 50% by atomic weight, and is preferably between about 5% and about 30% by atomic weight. The deposited films may contain C—H or C—F bonds throughout to provide hydrophobic properties to the silicon oxide layer resulting in significantly lower dielectric constants and improved moisture barrier properties.

Prior to deposition, reactive process gases are introduced into the chamber. Additionally, an inert gas such as helium may be used in the deposition to assist in plasma generation. The process gases containing the organosilicon compounds and the oxidizing gas may be carried by an inert gas, such as He, Ar, Ne, or a relatively inert gas, such as nitrogen, which are typically not incorporated into the film.

In a process where little or no carrier gas is introduced, the oxidation of the process gas deposits a film with low moisture content resulting in less shrinkage during subsequent processing of the film in comparison to films that retain more moisture. Reduced shrinkage of the film results in a smoother surface. The dielectric constant of these films show a range from about 2.6 to about 3.0 depending upon the deposition temperature. The process temperatures with the limited carrier gas supply is between about 10° C. and about 400° C. Preferably, no carrier gas is used in the oxidation reaction, but when a carrier gas is used, the carrier gas will preferably have a flow rate of less than or equal to the flow rate of the process gas containing the organosilicon compounds.

The silicon oxide layers are produced from organosilicon compounds containing carbon in organo groups that are not readily removed by oxidation at processing conditions. Suitable organo groups include alkyl, alkenyl, cyclohexenyl, and aryl groups and functional derivatives. The organosilicon compounds include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| tetramethylsilane, | $(CH_3)_4$—$Si$ |
| dimethylsilanediol, | $(CH_3)_2$—$Si$—$(OH)_2$ |
| ethylsilane, | $CH_3$—$CH_2$—$SiH_3$ |
| phenylsilane, | $C_6H_5$—$SiH_3$ |
| diphenylsilane, | $(C_6H_5)_2$—$SiH_2$ |
| diphenylsilanediol, | $(C_6H_5)_2$—$Si$—$(OH)_3$ |
| methylphenylsilane, | $C_6H_5$—$SiH_2$—$CH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —(—$SiH_2CH_2$—)$_3$—(cyclic) |
| dimethyldimethoxysilane, | $(CH_3)_2$—$Si$—$(OCH_3)_2$ |
| diethyldiethoxysilane, | $(CH_3CH_2)_2$—$Si$—$(OCH_2CH_3)_2$ |
| dimethyldiethoxysilane, | $(CH_3)_2$—$Si$—$(OCH_2CH_3)_2$ |
| diethyldimethoxysilane, | $(CH_3CH_2)_2$—$Si$—$(OCH_3)_2$ |
| 1,3-dimethyldisiloxane, | $CH_3$—$SiH_2$—$O$—$SiH_2$—$CH_3$ |
| 1,1,3,3-tetramethyldisiloxane, | $(CH_3)_2$—$SiH$—$O$—$SiH$—$(CH_3)_2$ |
| hexamethyldisiloxane, | $(CH_3)_3$—$Si$—$O$—$Si$—$(CH_3)_3$ |
| 1,3-bis(silanomethylene) disiloxane, | $(SiH_3$—$CH_2$—$SiH_2$—)$_2$—$O$ |
| bis(1-methyldisiloxanyl) methane, | $(CH_3$—$SiH_2$—$O$—$SiH_2$—)$_2$—$CH_2$ |
| 2,2-bis(1-methyldisiloxanyl) propane, | $(CH_3$—$SiH_2$—$O$—$SiH_2$—)$_2$—$C(CH_3)_2$ |
| 2,4,6,8-tetramethylcyclotetrasiloxane, | —(—$SiHCH_3$—$O$—)$_4$-(cyclic) |
| octamethylcyclotetrasiloxane, | —(—$Si(CH_3)_2$—$O$—)$_4$-(cyclic) |
| 2,4,6,8,10-pentamethylcyclopentasiloxane, | —(—$SiHCH_3$—$O$—)$_5$-(cyclic) |
| 1,3,5,7-tetrasilano-2,6-dioxy-4,8-dimethylene, | —(—$SiH_2$—$CH_2$—$SiH_2$—$O$—)$_2$-(cyclic) |
| 2,4,6-trisilanetetrahydropyran, | —$SiH_2$—$CH_2$—$SiH_2$—$CH_2$—$SiH_2$—$O$-(cyclic) |
| 2,5-disilanetetrahydrofuran, and fluorinated derivatives thereof. | —$SiH_2$—$CH_2$—$CH_2$—$SiH_2$—$O$-(cyclic), |

The organosilicon compounds are oxidized during deposition, preferably by reaction with oxygen ($O_2$) or oxygen containing compounds such as nitrous oxide ($N_2O$), carbon monoxide (CO), carbon dioxide ($CO_2$), and water ($H_2O$), preferably $O_2$ and $N_2O$. Organosilicon compounds that contain oxygen way be decomposed to provide the oxygen. The deposited film are further defined as having an atomic ratio of carbon to silicon (C:Si) in the film of less than about 1:1. Preferably, the carbon to silicon ratio in the film is between about 1:9 and about 3:4. The deposited films formed from oxidized organosilicon compounds have dielectric constants of less than about 3.0 and low moisture content.

Oxygen and oxygen containing compounds are dissociated to increase reactivity and achieve desired oxidation of the deposited film. RF power is coupled to the deposition chamber to increase dissociation of the oxidizing compounds. The oxidizing compounds may also be dissociated in a microwave chamber prior to entering the deposition chamber to reduce excessive dissociation of the organosilicon compounds.

Deposition of the silicon oxide layer can be continuous or discontinuous. Although deposition preferably occurs in a single deposition chamber, the layer can be deposited sequentially in two or more deposition chambers, e.g., to permit cooling of the film during deposition. Furthermore, RF power can be cycled or pulsed to reduce heating of the substrate, which promotes greater porosity in the deposited film. The oxidizing gas is preferably oxygen which is disassociated at a power density of at least 0.03 about W/cm$^2$. During deposition of the silicon oxide layer, the substrate is maintained at a temperature of between about −20° C. and about 500° C., and preferably is maintained at a temperature of between about 300° C. and about 450° C.

The organosilicon compounds preferably include the structure:

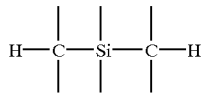

wherein each Si is bonded to at least two carbon (C) atoms, preferably 2 or 3 carbon atoms, and C is included in an organo group, preferably alkyl or alkenyl groups such as —CH$_3$, —CH$_2$—CH$_3$, —CH$_2$—, —CH$_2$—CH$_2$—, and fluorinated carbon derivatives thereof. The carbon atoms in the fluorinated derivatives may be partially or fuilly fluorinated to replace hydrogen atoms. When an organosilicon compound includes two or more Si atoms, each Si is separated from another Si by —O—, —C—, or —C—C—, wherein C is included in an organo group, preferably alkyl or alkenyl groups such as —CH$_2$—, —CH$_2$—CH$_2$—, —CH(CH$_3$)— or —C(CH$_3$)$_2$—, or fluorinated carbon derivatives thereof.

Preferred organosilicon compounds are gases or liquids near room temperature and can be volatilized above about 10 Torr. The preferred organosilicon compounds include:

| | |
|---|---|
| dimethylsilane, | (CH$_3$)$_2$—SiH$_2$ |
| trimethylsilane, | (CH$_3$)$_3$—SiH |
| tetramethylsilane, | (CH$_3$)$_4$—Si |
| dimethylsilanediol, | (CH$_3$)$_2$—Si—(OH)$_2$ |
| diphenylsilane, | (C$_6$H$_5$)$_2$—SiH$_2$ |
| diphenylsilanediol, | (C$_6$H$_5$)$_2$—Si—(OH)$_3$ |
| methylphenylsilane, | (C$_6$H$_5$)—SiH$_2$—CH$_3$ |
| bis(methylsilano)methane, | CH$_3$—SiH$_2$—CH$_2$—SiH$_2$—CH$_3$ |
| 1,2-bis(methylsilano)ethane, | CH$_3$—SiH$_2$—CH$_2$—CH$_2$—SiH$_2$—CH$_3$ |
| 1,3,5-trisilano-2,4,6-trimethylene, | —(—SiH$_2$CH$_2$—)$_3$-(cyclic) |
| 1,1,3,3-tetramethyldisiloxane, | (CH$_3$)$_2$—SiH—O—SiH—(CH$_3$)$_2$ |
| dimethyldimethoxysilane, | (CH$_3$)$_2$—Si—(OCH$_3$)$_2$ |
| diethyldiethoxysilane, | (CH$_3$CH$_2$)$_2$—Si—(OCH$_2$CH$_3$)$_2$ |
| dimethyldiethoxysilane, | (CH$_3$)$_2$—Si—(OCH$_2$CH$_3$)$_2$ |
| diethyldimethoxysilane, | (CH$_3$CH$_2$)$_2$—Si—(OCH$_3$)$_2$ |
| hexamethyldisiloxane, | (CH$_3$)$_3$—Si—O—Si—(CH$_3$)$_3$ |
| octamethylcyclotetrasiloxane, | —(—Si(CH$_3$)$_2$—O—)$_4$-(cyclic) | and fluorinated carbon derivatives thereof, such as: trifluorotrimethylsilane, (CF$_3$)$_3$—SiH.

The hydrocarbon groups in the organosilicon compounds may be partially or fully fluorinated to convert C—H bonds to C—F bonds. A combination of two or more of the organosilicon compounds can be employed to provide a blend of desired properties such as dielectric constant, oxide content, hydrophobicity, film stress, and plasma etching characteristics.

The oxidized compounds adhere to contacted surfaces such as a patterned layer of a semiconductor substrate to form a deposited film. The deposited films may be cured at low pressure and at temperatures from between about 100° C. and about 450° C., preferably above about 400° C., to remove remaining moisture and stabilize the barrier properties of the films. The deposited film has sufficient hydrocarbon content to be hydrophobic (i.e., repels water) which provides moisture barrier properties.

Films having low moisture content and low dielectric constants prior to curing are deposited by oxidizing organosilane compounds having two or three carbon atoms bonded to each silicon atom at a substrate temperature of between about 10° C. and about 450° C., preferably between about 300° C. and about 450° C. The organosilicon compounds are introduced into a processing chamber maintained at a chamber pressure of between about 200 milliTorr and about 20 Torr, preferably between about 2.5 Torr and about 10 Torr, at a flow rate of between about 5 sccm and 1000 sccm, preferably at about 600 sccm.

An oxidizing gas may be introduced into the chamber at a flow rate of less than or equal to about 200 sccm, and preferably at about 100 sccm. More preferably, oxygen is introduced into the chamber at a flow rate of less than or equal to the flow rate of the organosilicon compounds. When a carrier gas is used in the deposition process, the carrier gas is introduced at a flow rate of between about 0 sccm and 2000 sccm, preferably with a flow rate of less than or equal to the flow rate of the organosilicon compounds. The reaction is plasma enhanced with a power density ranging between about 0.03 W/cm$^2$ and about 3.2 W/cm$^2$, preferably between about 0.9 W/cm$^2$ and about 3.2 W/cm$^2$. Optionally, a bias power having a power density ranging between about 0 W/cm$^2$ and about 1.6 W/cm$^2$, e.g., a bias power level of between about 0 watts and about 500 watts for a 200 mm substrate, preferably at about 250 watts, can be applied during the deposition process to provide improved filing of features formed on a substrate. The bias power promotes even filling of features such as vias and contact holes by etching the film as it is deposited.

For producing a low dielectric constant film that has good hydrophobic properties, and is resistant to cracking, organosilicon compounds are used which will produce films wherein each silicon atom is bonded to at least one carbon atom, preferably two or three carbon atoms, and each silicon atom is bonded to one or two hydrogen atoms.

An oxygen rich surface, or oxide cap, can be formed adjacent the low dielectric constant film to modify the surface of the film and improve interlayer adhesion. The oxygen rich surface is formed by exposing the organosilicon compound deposited on the surface of the low k film to higher amounts of oxygen. Preferably, an oxygen plasma is formed following deposition of the low k film by terminating the flow of the precursor while continuing or increasing the oxygen flow. The increased oxygen replaces additional carbon at the surface of the low k film to for a silicon oxide layer. Prior to depositing the low dielectric constant film, an oxygen rich surface can be provided on the underlying substrate surface by depositing the film as described above, except for increasing the amount of oxygen at the start of the deposition process. The oxygen flow is increased for a time sufficient to remove additional carbon from the deposited film and form a silicon oxide layer having low amounts of carbon.

In an exemplary deposition process for a 200 mm substrate, the oxygen has a flow rate of less than about 2000 sccm, preferably at a flow rate of about 100 sccm and about 1000 sccm, and most preferably at about 700 sccm. The plasma is generated at a power density ranging between about 0.03 W/cm$^2$ and about 3.2 W/cm$^2$, preferably between about 0.9 W/cm$^2$ and about 3.2 W/cm$^2$. For a 200 mm substrate, the power density provides for a power level of between about 300 watts and about 1000 watts, preferably at about 600 watts, for a time of between about 5 seconds and about 60 seconds. The depth of the oxygen rich surface is less than about 200 Å, preferably about 150 Å. The temperature of the deposition process is maintained at between about 10° C. and about 450° C., preferably between about 300° C. and about 450° C., with the chamber pressure at between about 200 milliTorr and about 20 Torr, preferably between about 2.5 Torr and 10 Torr.

In a preferred embodiment, the oxide rich surface is formed on the deposited low k film by flowing oxygen at a rate of about 700 sccm into a chamber maintained at a pressure of about 4 Torr and generating a plasma by applying an RF power of about 600 watts for about thirty seconds for a 200 mm diameter substrate. It was observed that there was no adverse impact on the dielectric constant of the deposited low k film and that the properties of the oxygen rich surface formed on the low k film could be further improved by turning off the pump evacuating the processing chamber after generating the plasma. It has also been observed that the process for forming an oxygen rich surface converted the surface of the deposited low k film from hydrophobic (with a measured wet angle of between about 80° and about 100°) to hydrophilic (with a measured wet angle of less than 45°), with or without the use of surfactants.

It is contemplated that a film formed from the oxidation reaction has a greater number of oxygen links, —O—, and significantly less Si—H bonds in comparison to films deposited without the disassociated oxygen due to the presence of more reactive sites in each silicon atom. By minimizing the number of Si—H bonds in the film, a higher cracking threshold and less moisture uptake can be introduced in a deposited film. Additionally, less Si—H bonding groups make a film more resistant to etching and to oxygen ashing of the film after etching, thereby providing improved mechanical properties. If desired, enough Si—H bonds can be retained to form subsequent hydrophobic layers.

The deposition process of the present invention can be performed in a substrate processing system as described in more detail below.

Exemplary CVD Plasma Reactor

FIG. 1 shows a vertical, cross-section view of a parallel plate chemical vapor deposition reactor 10 having a high vacuum region 15. The reactor 10 contains a gas distribution manifold 11 for dispersing process gases through perforated holes in the manifold to a substrate or wafer (not shown) that rests on a substrate support plate or susceptor 12 which is raised or lowered by a lift motor 14. A liquid injection system (not shown), such as typically used for liquid injection of TEOS, may also be provided for injecting a liquid organosilicon compound.

The reactor 10 includes heating of the process gases and substrate, such as by resistive heating coils (not shown) or external lamps (not shown). Referring to FIG. 1, susceptor 12 is mounted on a support stem 13 so that susceptor 12 (and the wafer supported on the upper surface of susceptor 12) can be controllably moved between a lower loading/off-loading position and an upper processing position which is closely adjacent to manifold 11.

When susceptor 12 and the wafer are in processing position 14, they are surrounded by a an insulator 17 and process gases exhaust into a manifold 24. During processing, gases inlet to manifold 11 are uniformly distributed radially across the surface of the wafer. A vacuum pump 32 having a throttle valve controls the exhaust rate of gases from the chamber. Before reaching manifold 11, deposition and carrier gases are input through gas lines 18 into a mixing system 19 where they are combined and then sent to manifold 11. Generally, the process gases supply line 18 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or a plasma enhanced process. In a plasma process, a controlled plasma is typically formed adjacent to the wafer by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RFI) of 13.56 MHz to the distribution manifold 11 and at a low RF frequency (RF2) of 360 KHz to the susceptor 12. The silicon oxide layers of the present invention are most preferably produced using low levels of constant high frequency RF power or pulsed levels of high frequency RF power.

When additional dissociation of the oxidizing gas is desired, an optional microwave chamber 28 can be used to input from between about 0 Watts and about 6000 Watts of microwave power to the oxidizing gas prior to entering the deposition chamber. Separate addition of microwave power would avoid excessive dissociation of the organosilicon compounds prior to reaction with the oxidizing gas. A gas distribution plate having separate passages for the organosilicon compound and the oxidizing gas is preferred when microwave power is added to the oxidizing gas.

Typically, any or all of the chamber lining, distribution manifold 11, susceptor 12, and various other reactor hardware is made out of material such as aluminum or anodized aluminum. An example of such a CVD reactor is described in U.S. Pat. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The lift motor 14 raises and lowers susceptor 12 between a processing position and a lower, wafer-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12 .

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

The system controller 34 operates under the control of a computer program stored on the hard disk drive 38. The computer program dictates the timing, mixture of gases, RF power levels, susceptor position, and other parameters of a particular process.

Figure 2:
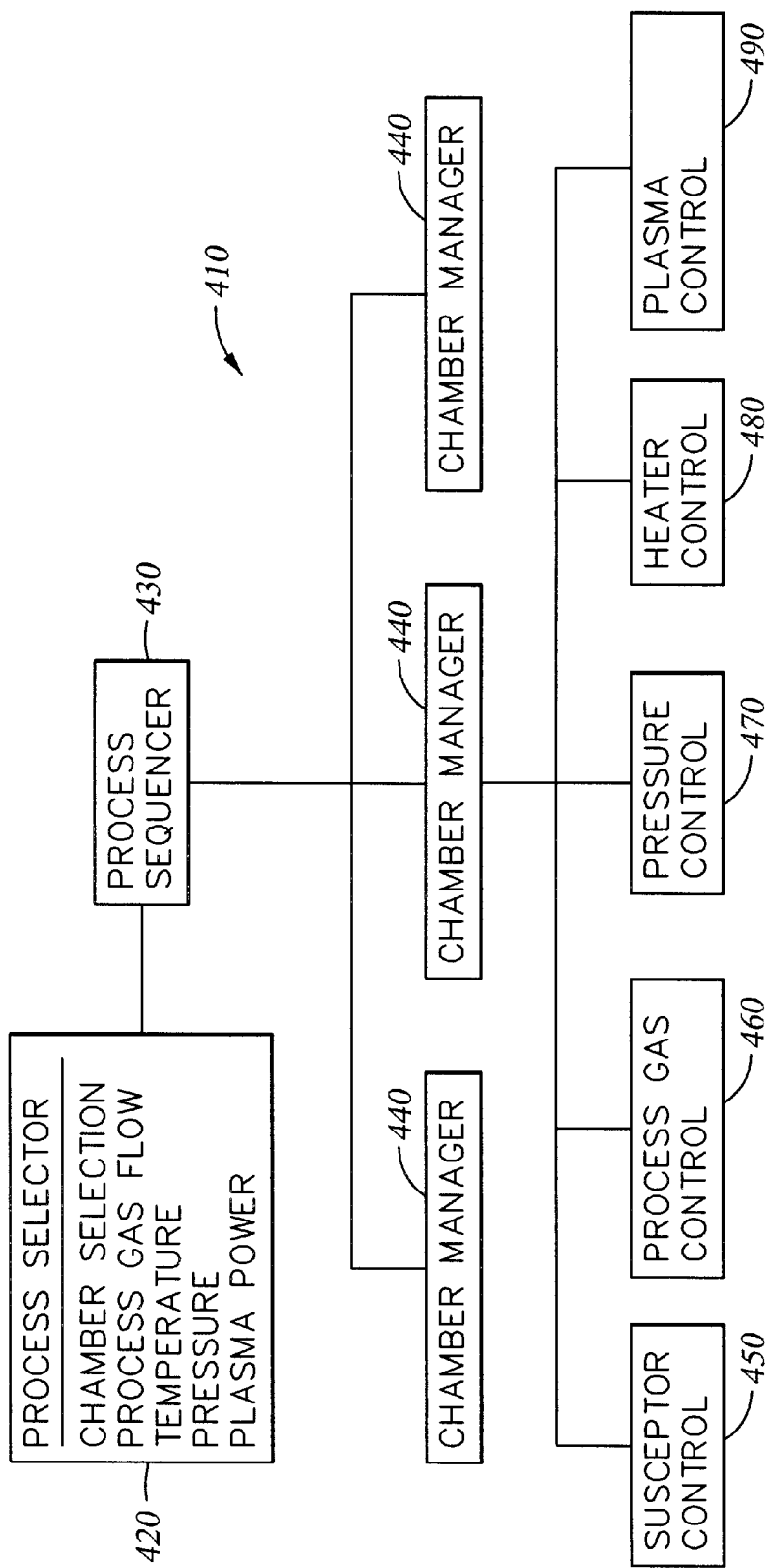
FIG. 2 is a flow chart of a process control computer program product used in conjunction with the exemplary CVD plasma reactor of FIG. 1.

Referring to FIG. 2, the process can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 the (i) selects a desired process chamber on a cluster tool such as an Centura®platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be. executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10. Process In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 450 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440. The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is flowed into the reactor 10 to stabilize the pressure in the chamber before reactive process gases are introduced into the chamber. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, for example 1,3,5-trisilano-2,4,6-trimethylene (1,3,5-trisilanacyclo-hexane), the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the reactor 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the reactor 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Dual Damascene Integration

FIGS. 3A–3D are cross sectional views of a substrate showing underlying layers following sequential steps in a dual damascene process. The dual damascene structure 800 comprises silicon oxide layers having low dielectric constants to reduce cross-talk between metal lines.

Figure 3A:
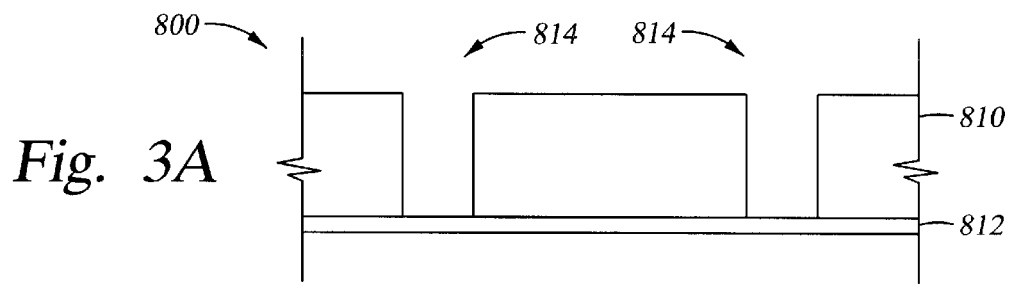
FIGS. 3A–3D are cross-sectional views showing an integrated dual damascene deposition sequence wherein the silicon oxide of the present invention is used to eliminate a conventional etch stop.

As shown in FIG. 3A, a first or via level dielectric layer 810 is deposited and pattern etched on the substrate 812. The via level dielectric layer can be deposited on the substrate 812 by conventional means known in the art, but is preferably deposited by oxidizing one or more organosilicon compounds at a RF power density of at least about 0.03 W/cm$^2$ to deposit a silicon oxide film having a carbon content of at least 1% by atomic weight. The via level dielectric layer 810 preferably has a carbon content of about 20 percent by atomic weight, and is deposited to a thickness of between about 5,000 and about 10,000 Å, depending on the size of the structure to be fabricated. The via level dielectric layer is preferably deposited by reacting $O_2$ and trimethylsilane at an RF power level of about 600 W for a 200 mm diameter substrate with a chamber pressure of about 4 Torr and a substrate temperature of about 350° C. Once deposited, the via level dielectric layer is then pattern etched to form the vias and contact holes 814 with photolithography and etch processes for silicon oxide films using fluorine, carbon, and oxygen ions.

Figure 3B:
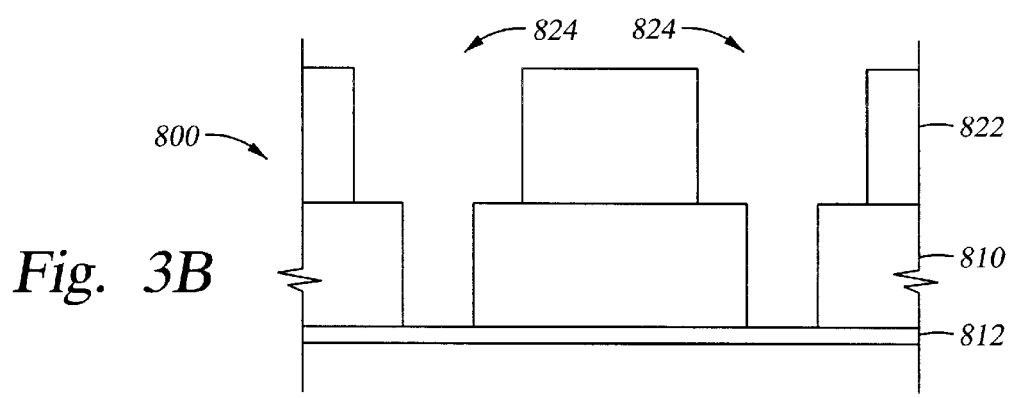

As shown in FIG. 3B, a second, or trench level dielectric layer 822 comprises a silicon oxide layer deposited by oxidizing one or more organosilicon compounds at a RF power density of at least about 0.03 W/cm$^2$ to produce a film having a carbon content of at least 1% by atomic weight. The trench level dielectric layer 822 preferably has a carbon content of about 10% by atomic weight, and is deposited over the via level dielectric layer 810 to a thickness of between about 5,000 and about 10,000 Å. The trench level dielectric layer is preferably deposited by reacting O$_2$ and dimethylsilane at an RF power level of about 600 W for a 200 mm diameter substrate with a chamber pressure of about 4 Torr and a substrate temperature of about 350° C. The trench level dielectric layer 822 is then pattern etched to define interconnect lines 824 as shown in FIG. 3B, using photolithography processes and etch processes. The etch process used for the trench level dielectric layers is preferably more effective for silicon oxides having lower carbon contents to reduce over-etching of the via level dielectric layer. Any photo resist or other material used to pattern the dielectric layers is removed using chemical mechanical polishing, an oxygen strip, or other suitable process.

Figure 3C:
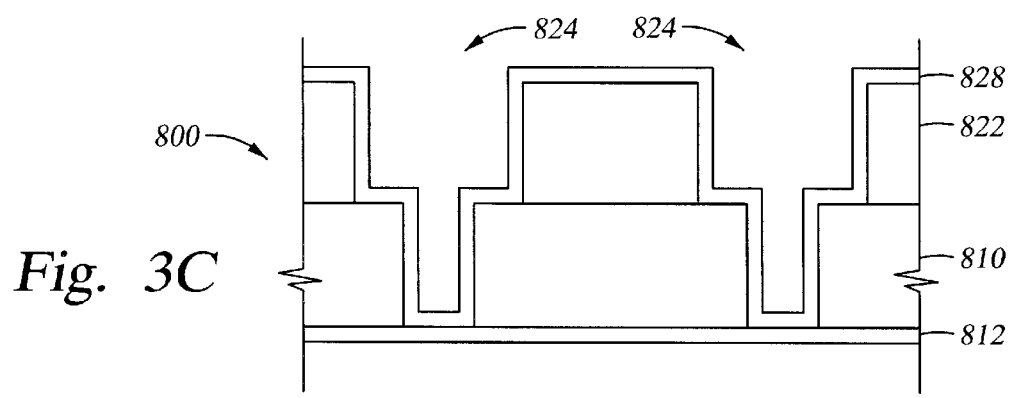
Figure 3D:
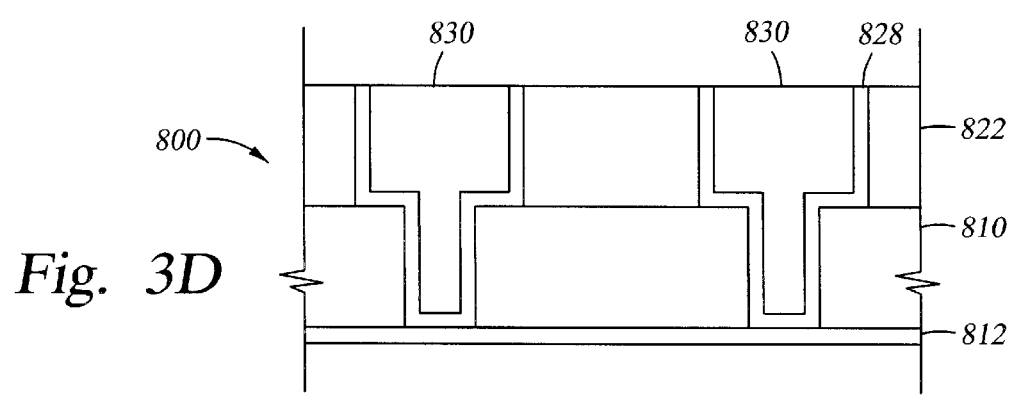

The metallization structure is then formed with a conductive material such as aluminum, copper, tungsten or combinations thereof Presently, the trend is to use copper to form the smaller features due to the low resistivity of copper compared to aluminum. Preferably, as shown in FIG. 3C, a suitable barrier layer 828 such as tantalum nitride is first deposited conformally in the metallization pattern to prevent copper migration into the surrounding silicon and/or dielectric material. Thereafter, copper 830 is deposited as shown in FIG. 4D using either chemical vapor deposition, physical vapor deposition, electroplating, or combinations thereof to form the conductive structure. Once the structure has been filled with copper or other metal, the surface is planarized using chemical mechanical polishing or other planarizing methods.

In an alternative embodiment of a dual damascene structure (not shown), both the via level and the trench level dielectric layers could contain essentially the same amount of carbon, e.g., about 10% carbon by atomic weight, if separated by an etch stop layer that contains a different amount of carbon, e.g., about 20% carbon by atomic weight. The etch stop layer would be pattern etched to define the vias and contact holes as described above.

Referring to FIGS. 3A–3D, the dielectric layers 810, 812 are deposited in the reactor 10 by introducing an oxidizing gas, preferably O$_2$, an organosilicon compound, such as (CH$_3$)$_3$SiH, (CH$_3$)$_2$SiH$_2$, or combinations thereof, and a carrier gas, such as helium. The substrate is maintained at a temperature between about −20° C. and about 500° C., and preferably is maintained at a temperature of approximately 300° C. to 450° C., throughout the deposition of the dielectric layer. The dielectric layer is deposited with a process gas that includes a mixture of the organosilicon compound at a flow rate of between about 5 sccm and about 1000 sccm and the oxidizing gas at a flow rate of less than about 200 sccm. In depositing layers with a smooth surface and low dielectric constants, the carrier gas typically has a flow rate less than or equal to the flow rate of the process gas that includes a mixture of the organosilicon compound. In this instance, the carrier gas has a flow rate of between about 0 sccm and about 1000 sccm. The carrier gas is optional, since the process gas oxidation reaction can occur in the total absence of a carrier gas to deposit a smooth surface dielectric layer.

The process gases react at a pressure from between about 0.2 and about 20 Torr, preferably between about 2.5 Torr and about 10 Torr, to form a conformal silicon oxide layer. Generally, it has been observed that a higher deposition pressure will produce films with lower dielectric constants, or higher carbon contents, but such a trend may not be true for all identified precursors under the identified processing parameters.

The process temperature range is preferably between about 10° C. and about 450° C. for depositing layers with a smooth surface and a low dielectric constant (k 2.6–3.0). The dielectric constant depends upon the process temperature with a lower temperature generally producing a lower dielectric constant. The reaction is plasma enhanced with a power density ranging between about 0.03 W/cm$^2$ and about 3.2 W/cm$^2$. It has been further observed that the lower dielectric films can be produced at lower power rates.

For an 8" single wafer chamber, the high frequency RF source of approximately 13.56 MHz is preferably connected to a gas distribution system and driven at between about 10 and about 1000 W while a low frequency RF source of about 350 KHz to 1 MHz is optionally connected to a susceptor and driven at between about 0 W and about 500 W. In a preferred embodiment, the high frequency RF source is driven at between about 300 W and about 1000 W of continuous or pulsed RF power, and the low frequency RF source is driven at about 0 and about 50W of pulsed RF power at a duty cycle from 10% to 30% for a 200 mm diameter substrate. The pulsed RF power is preferably cycled in short intervals, most preferably having a frequency less than about 200 Hz.

The oxidized organosilicon layer may be cured at a pressure less than about 10 Torr a temperature from between about 100° C. and about 450° C. Optionally, curing could be conducted after deposition of additional dielectric layers.

The above process conditions result in the deposition of a dielectric layer (at about 2000 Å per minute) with good hydrophobic properties, good resistance to cracking, and improved barrier characteristics for subsequently deposited layers. The deposited dielectric layers have a With the limited carrier gas flow rate, the deposited layer 300 has a low dielectric, typically 2.6 to 3.0 and has a smooth surface which is beneficial to the deposition of subsequent layers and etching processes. The lining layer obtained from trimethylsilane has sufficient C—H bonds to be hydrophobic, and is an excellent moisture barrier. Deposition of a hydrophobic lining layer has a surprising and unexpected result of converting subsequent hydrophilic layers to hydrophobic layers. Additionally, by limiting an oxidizing gas in the oxidation reaction, a film can be produced with a lower amount of Si—H bonds that has a high cracking threshold while still retaining the desired hydrophobic properties.

Preferred organosilicon compounds containing carbon of the invention may also be used as a gap filling layer over the etch stop in place of the dielectric films deposited by the process detailed above. The process gases for the gap filling layer are preferably (CH$_3$)$_2$SiH$_2$ and 50 wt. % of hydrogen peroxide (H$_2$O$_2$) which is vaporized and mixed with an inert carrier gas, such as helium. Alternative organosilicon compounds can be used if byproducts are vapors at deposition conditions. Preferred alternative compounds incorporate oxysilano or silano groups, such as:
trimethylsilane,
disilanomethane,
bis(methylsilano)methane,
1,2-disilanoethane,
2,2-disilanopropane,
1,3,5-trisilano-2,4,6-trimethylene(cyclic),
1,3-bis(silanomethylene)siloxane,
bis(1-methyldisiloxanyl)methane,
2,4,6,8-tetramethylcyclotetrasiloxane, or
1,2-disilanotetrafluoroethane.

The process gas flows range from between about 0 and about 2000 sccm for He, between about 10 and about 200 sccm for CH₃SiH, and between about 0.1 and about 3 g/min. for H₂O₂. The preferred gas flows range from between about 100 and about 500 sccm for He, between about 20 and about 100 sccm for CH₃SiH, and between about 0.1 and about 1 g/min. for H₂O₂. These flow rates are given for a chamber having a volume of approximately between about 5.5 and about 6.5 liters.

The invention is further described by the following examples.

EXAMPLES

The following examples demonstrate the deposition of oxidized organosilicon films having smooth surfaces, good hydrophobic properties, high cracking thresholds, and low dielectric constants on 200 mm diameter substrates. This example was undertaken using a chemical vapor deposition chamber, and in particular, a "CENTURA DxZ" system which includes a solid-state RF matching unit with a two-piece quartz process kit, both fabricated and sold by Applied Materials, Inc., Santa Clara, Calif.

Example of Low Dielectric Constant Film with Smooth Surface

An oxidized trimethylsilane film was deposited at a chamber pressure of 4.0 Torr and a temperature of 350° C. from reactive gases which were flowed into the reactor as follows:

| | |
|---|---|
| Trimethylsilane, (CH₃)₃SiH, at | 600 sccm |
| Oxygen, O₂, at | 100 sccm |
| Helium, He, at | 0 sccm |

The substrate was positioned 220 millimeters from the gas distribution showerhead and 600 W of high frequency power (13.56 MHz) was applied to the showerhead for plasma enhanced deposition of an oxidized trimethylsilane layer at an observed rate of about 7000 Å/minute. The oxidized trimethylsilane material had a dielectric constant of about 2.8+/−0.1, a carbon content of about 17%, a thickness uniformity of less than about 3%, and was hydrophobic. The deposited film indicated a RMS (root-mean-square) thickness of 5 Å and a $R_{max}$ (peak to valley) distance of 75 Å, which is less than the observed 60 Å RMS and 500 Å $R_{max}$ in films deposited with a carrier gas. The data from the sample dielectric layers indicate the films of the present invention have much smoother surfaces than prior techniques. Dielectric constant measurements of films produced under the above processing conditions show a dielectric constant range of about 2.6 to 3.0 depending upon the deposition temperatures.

Example of High Cracking Threshold and Low Dielectric Constant

An oxidized trimethylsilane film was deposited at a chamber pressure of 4 Torr and a temperature of 350° C. from reactive gases which were flowed into the reactor as follows:

| | |
|---|---|
| Trimethylsilane, (CH₃)₃SiH, at | 600 sccm |
| Oxygen, O₂, at | 100 sccm |
| Helium, He, at | 0 sccm |

The substrate was positioned 220 millimeters from the gas distribution showerhead and 600 W of high frequency power (13.56 MHz) was applied to the showerhead for plasma enhanced deposition of an oxidized trimethylsilane layer at an observed rate of about 7000 Å/minute. The oxidized trimethylsilane material had a dielectric constant of about 2.8+/−0.1, a thickness uniformity of about less than about 3%, and was hydrophobic.

While the foregoing is directed to preferred embodiments of the present invention, other and further embodiments of the invention may be devised without departing from the basic scope thereof, and the scope thereof is determined by the claims which follow.

What is claimed is:

1. A process for depositing a low dielectric constant film, comprising oxidizing one or more oxygen-free organosilicon compounds at a RF power density of at least about 0.03 W/cm² to deposit a film having a carbon content of at least 1% by atomic weight, wherein oxidizing gases have a flow rate of less than or equal to the flow rate of the one or more oxygen-free organosilicon compounds.

2. The process of claim 1, wherein the low dielectric constant film has an atomic ratio of carbon to silicon (C:Si) of less than about 1:1.

3. The process of claim 1, wherein the low dielectric constant film has an atomic ratio of carbon to silicon (C:Si) between about 1:4 and about 3:4.

4. The process of claim 1, wherein the one or more oxygen-free organosilicon compounds have a flow rate of between about 5 sccm and about 1000 sccm.

5. The process of claim 1, wherein the one or more oxygen-free organosilicon compounds are reacted with oxygen in the absence of a carrier gas.

6. The process of claim 1, wherein each silicon atom in the one or more oxygen-free organosilicon compounds is bonded to at least two carbon atoms, and wherein two or more silicon atoms in the same molecule are separated by no more than two carbon atoms.

7. The process of claim 1, wherein the one or more oxygen-free organosilicon compounds are selected from a group consisting of dimethylsilane, trimethylsilane, tetramethylsilane, diphenylsilane, methylphenylsilane, bis (methyl-silano)methane, 1,2-bis(methylsilano)ethane, 1,3,5-trisilano-2,4,6-trimethylene, fluorinated carbon derivatives thereof, and combinations thereof.

8. The process of claim 1, wherein the one or more oxygen-free organosilicon compounds has two or more methyl groups bonded to each silicon atom.

9. The process of claim 1, wherein the one or more oxygen-free organosilicon compounds are selected from the group consisting of dimethylsilane, trimethylsilane, 1,2-bis (methylsilano)ethane, fluorinated carbon derivatives thereof, and combinations thereof.

10. The process of claim 1, wherein the low dielectric constant film is deposited at a temperature of between about 10° C. and about 500° C.

11. The process of claim 1, wherein the one or more oxygen-free organosilicon compounds have a carbon to silicon atomic ratio of at least about 2:1.

12. The process of claim 11, wherein the one or more oxygen-free organosilicon compounds are selected from the group consisting of dimethylsilane, trimethylsilane, and combinations thereof.

13. The process of claim 1, wherein the one or more oxygen-free organosilicon compounds have a carbon to silicon atomic ratio of 3:1.

14. The process of claim 13, wherein the oxygen-free organosilicon compound is trimethylsilane.

15. The process of claim 4, further comprising a carrier gas having a flow rate less than or equal to the flow rate of the one or more oxygen-free organosilicon compounds.

16. The process of claim 1, wherein oxygen has a flow rate of less than or equal to about 200 sccm.

17. The process of claim 1, wherein the RF power density is between about 0.9 W/cm² and about 3.2 W/cm².

18. The process of claim 1, wherein the film is deposited at a chamber pressure of between about 0.2 Torr and about 20 Torr.

19. The process of claim 10, wherein the film is deposited at a temperature of between about 300° C. and about 450° C.

20. The process of claim 1, further comprising forming an oxide rich surface adjacent the low dielectric constant film.

21. The process of claim 20, wherein forming the oxide rich surface comprises introducing oxygen into a processing chamber and generating a plasma.

22. The process of claim 21, wherein the oxygen has a flow rate of less than 2000 sccm and the plasma is generated at a power density of between about 1.43 W/cm² and about 3.2 W/cm².

23. The process of claim 20, wherein the low dielectric constant film is exposed to the plasma between about 5 seconds and about 60 seconds.

24. A process for depositing a low dielectric constant film, comprising oxidizing one or more oxygen-free organosilicon compounds containing carbon with an oxidizing gas disassociated at a power density of greater than about 0.03 W/cm², wherein the oxidizing gas has a flow rate of less than or equal to the flow rate of the oxygen-free organosilicon compounds and a carrier gas has a flow rate less than or equal to the flow rate of the oxygen-free organosilicon compounds at conditions sufficient to deposit a silicon oxide film having an atomic ratio of carbon to silicon (C:Si) of greater than or equal to about 1:9.

25. The process of claim 24, wherein the atomic ratio of carbon to silicon (C:Si) is less than about 1:1 in the film.

26. The process of claim 24, wherein the atomic ratio of carbon to silicon (C:Si) is between about 1:4 and about 3:4 in the film.

27. The process of claim 24, wherein the oxidizing gas is selected from a group consisting of oxygen, nitrous oxide, carbon dioxide, carbon monoxide, and water vapor, and combinations thereof.

28. The process of claim 27, wherein the oxidizing gas is oxygen.

29. The process of claim 24, wherein each silicon atom in the one or more oxygen-free organosilicon compounds is bonded to at least one carbon atom, and wherein two or more silicon atoms in the same molecule are separated by no more than two carbon atoms or by no more than one oxygen atom.

30. The process of claim 29, wherein the one or more oxygen-free organosilicon compounds are selected from a group consisting of dimethylsilane, trimethylsilane, bis(methylsilano)methane, 1,2-bis(methylsilano)ethane, 1,3,5-trisilano-2,4,6-trimethylene, fluorinated carbon derivatives thereof, and combinations thereof.

31. The process of claim 24, wherein the one or more oxygen-free organosilicon compounds have one or more methyl groups.

32. The process of claim 24, wherein the one or more oxygen-free organosilicon compounds are selected from the group consisting of methylsilane, dimethylsilane, trimethylsilane, and combinations thereof.

33. The process of claim 24, wherein the one or more oxygen-free organosilicon compounds have a carbon to silicon atomic ratio of at least about 2:1.

34. The process of claim 29, wherein the one or more oxygen-free organosilicon compounds are selected from the group consisting of dimethylsilane, trimethylsilane, 1,2-bis(methylsilano)ethane, fluorinated carbon derivatives thereof, and combinations thereof.

35. The process of claim 25, wherein the one or more organosilicon compounds have a carbon to silicon atomic ratio of at least about 3:1.

36. The process of claim 35 wherein the oxygen-free organosilicon compound is trimethylsilane.

37. The process of claim 24, wherein the low dielectric constant film is deposited at a temperature of between about 300° C. and about 450° C.

38. The process of claim 24, wherein the low dielectric constant film is deposited at a processing chamber pressure of between about 0.2 Torr and about 20 Torr.

39. The process of claim 24, wherein the power is provided at a power density ranging between about 0.9 W/cm² and about 3.2 W/cm².

40. The process of claim 24, wherein the one or more oxygen-free organosilicon compounds have a flow rate of between about 5 sccm and about 1000 sccm.

41. The process of claim 24, wherein oxygen has a flow rate of less than or equal to about 200 sccm.

42. The process of claim 24, further comprising forming an oxide rich surface adjacent the low dielectric constant film.

43. The process of claim 42, wherein forming the oxide rich surface comprises introducing oxygen into a processing chamber and generating a plasma.

44. The process of claim 43, wherein the oxygen has a flow rate of less than 2000 sccm and the plasma is generated at a power density ranging between about 1.4 W/cm² and about 3.2 W/cm².

45. The process of claim 44, wherein the low dielectric constant film is exposed to the plasma between about 5 seconds and about 60 seconds.

46. A process for depositing a low dielectric constant film, comprising reacting one or more oxygen-free organosilicon compounds that contain a carbon to silicon atomic ratio of at least about 2:1 with an oxidizing gas disassociated at a power density ranging between about 0.9 W/cm² and about 3.2 W/cm², wherein the oxidizing gas has a flow rate of less than or equal to the flow rate of the oxygen-free organosilicon compounds at conditions sufficient to deposit a film having an atomic ratio of carbon to silicon (C:Si) of between about 1:9 and less than about 1:1.

47. The process of claim 46, wherein the atomic ratio of carbon to silicon (C:Si) is between about 1:4 and about 3:4 in the film.

48. The process of claim 46, wherein the one or more oxygen-free organosilicon compounds are selected from a group consisting of dimethylsilane, trimethylsilane, 1,2-bis(methylsilano)ethane, fluorinated carbon derivatives thereof, and combinations thereof.

49. The process of claim 48, wherein the oxygen-free organosilicon compound is dimethylsilane.

50. The process of claim 46, wherein the one or more oxygen-free organosilicon compounds have a carbon to silicon atomic ratio of at least about 3:1.

51. The process of claim 50, wherein the oxygen-free organosilicon compound is trimethylsilane.

52. The process of claim 46, wherein the oxidizing gas is selected from a group consisting of oxygen, nitrous oxide, carbon dioxide, carbon monoxide, and water vapor, and combinations thereof.

53. The process of claim 46, wherein the oxidizing gas is oxygen.

54. The process of claim 46, wherein the low dielectric constant film is deposited at a temperature of between about 300° C. and about 450° C.

55. The process of claim 46, wherein the low dielectric constant film is deposited at a processing chamber pressure of between about 0.2 Torr and about 20 Torr.

56. The process of claim 46, wherein the RF power density is provided at between about 0.9 W/cm$^2$ and about 3.2 W/cm$^2$.

57. The process of claim 46, wherein the one or more oxygen-free organosilicon compounds have a flow rate of between about 5 sccm and about 1000 sccm.

58. The process of claim 46, wherein oxygen has a flow rate of less than or equal to about 200 sccm.

59. The process of claim 46, further comprising a carrier gas having a flow rate less than or equal to the flow rate of the one or more oxygen-free organosilicon compounds.

60. The process of claim 46, further comprising forming an oxide rich surface adjacent the low dielectric constant film.

61. The process of claim 60, wherein forming the oxide rich surface comprises introducing oxygen into a processing chamber and generating a plasma.

62. The process of claim 61, wherein the oxygen has a flow rate of less than 2000 sccm and the plasma is generated at a power density of between preferably between about 1.43 W/cm$^2$ and about 3.2 W/cm$^2$.

63. The process of claim 62, wherein the low dielectric constant film is exposed to the plasma between about 5 seconds and about 60 seconds.

* * * * *

UNITED STATES PATENT AND TRADEMARK OFFICE
CERTIFICATE OF CORRECTION

PATENT NO.    : 6,593,247 B1
DATED         : July 15, 2003
INVENTOR(S)   : Huang et al.

It is certified that error appears in the above-identified patent and that said Letters Patent is hereby corrected as shown below:

Column 5,
Line 33, please change "fuilly" to -- fully --.

Column 8,
Line 2, please change "by a an insulator" to -- by an insulator --.
Line 30, please change "(RFI)" to -- (RF1) --.

Column 10,
Line 9, please change "be.executed" to -- be executed --.
Line 36, please delete "Process" and begin a new paragraph with "In operation,".
Line 64, please begin a new paragraph with "The process gas".

Column 13,
Line 22, please change "thereofPresently," to -- thereof. Presently, --

Column 14,
Line 35, please delete "The deposited dielectric layers have a"

Signed and Sealed this

Fourteenth Day of October, 2003

JAMES E. ROGAN
*Director of the United States Patent and Trademark Office*